(12) United States Patent
Yamada et al.

(10) Patent No.: US 12,324,085 B2
(45) Date of Patent: Jun. 3, 2025

(54) MICROWAVE PLASMA TREATMENT DEVICE

(71) Applicant: NATIONAL INSTITUTE OF ADVANCED INDUSTRIAL SCIENCE AND TECHNOLOGY, Tokyo (JP)

(72) Inventors: Hideaki Yamada, Ikeda (JP); Akiyoshi Chayahara, Ikeda (JP); Yoshiaki Mokuno, Ikeda (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 168 days.

(21) Appl. No.: 18/274,422

(22) PCT Filed: Jan. 25, 2022

(86) PCT No.: PCT/JP2022/002724
§ 371 (c)(1),
(2) Date: Jul. 26, 2023

(87) PCT Pub. No.: WO2022/163661
PCT Pub. Date: Aug. 4, 2022

(65) Prior Publication Data
US 2024/0098866 A1 Mar. 21, 2024

(30) Foreign Application Priority Data
Jan. 27, 2021 (JP) .................................. 2021-011549

(51) Int. Cl.
*H05H 1/00* (2006.01)
*C23C 16/511* (2006.01)
*H05H 1/46* (2006.01)

(52) U.S. Cl.
CPC ............. *H05H 1/01* (2021.05); *C23C 16/511* (2013.01); *H05H 1/4622* (2021.05)

(58) Field of Classification Search
CPC ....... H05H 1/01; H05H 1/4622; C23C 16/511
See application file for complete search history.

(56) References Cited

U.S. PATENT DOCUMENTS 11,037,764 B2 * 6/2021 Kraus ................ H01J 37/32669
11,081,317 B2 * 8/2021 Chua ........................ H03F 3/195
(Continued)

FOREIGN PATENT DOCUMENTS

CN 107754572 A * 3/2018 ........... B01D 53/007
DE 102018000401 A1 * 7/2019 ........ H01J 37/32192
(Continued)

OTHER PUBLICATIONS

Japanese Office Action for Japanese Application No. 2022-578418, dated Apr. 16, 2024, with an English translation.
(Continued)

*Primary Examiner* — Adam D Houston
(74) *Attorney, Agent, or Firm* — Birch, Stewart, Kolasch & Birch, LLP

(57) ABSTRACT

A microwave plasma treatment device includes a resonator including a container; a single microwave oscillation source that outputs a reference microwave; a waveguide that connects the microwave oscillation source and the resonator to each other; and a phase control mechanism that generates a modified microwave having a phase different from a phase of the reference microwave by controlling the phase of the reference microwave. The resonator includes one or more first-type introducing portions for introducing the reference microwave into the resonator and one or more second-type introducing portions for introducing the modified microwave into the resonator, and the microwave plasma treat-
(Continued)

ment device is configured such that at least one of a position, a size, and a shape of a plasma ball generated in the container is changed by superimposing the modified microwave on the reference microwave in the resonator.

10 Claims, 5 Drawing Sheets

(56) References Cited

U.S. PATENT DOCUMENTS

| | | | | |
|---|---|---|---|---|
| 11,393,661 | B2* | 7/2022 | Nguyen | H01J 37/32201 |
| 11,993,843 | B2* | 5/2024 | Kim | C23C 16/4411 |
| 12,014,898 | B2* | 6/2024 | Calkins | H01J 37/3244 |
| 12,016,109 | B2* | 6/2024 | Lee | H05H 1/466 |
| 12,131,885 | B2* | 10/2024 | Arakawa | H01J 37/32183 |
| 12,159,788 | B2* | 12/2024 | van Druenen | C23C 16/32 |
| 2009/0159214 | A1* | 6/2009 | Kasai | H01J 37/32192 422/186.04 |
| 2011/0174778 | A1* | 7/2011 | Sawada | H01J 37/32165 118/723 R |
| 2012/0090782 | A1* | 4/2012 | Ikeda | H01J 37/32293 156/345.28 |
| 2012/0247676 | A1* | 10/2012 | Fujino | H01J 37/32211 118/723 MW |
| 2013/0192760 | A1* | 8/2013 | Ikeda | H01J 37/32192 156/345.41 |
| 2014/0008326 | A1 | 1/2014 | Toyoda et al. | |
| 2015/0170881 | A1* | 6/2015 | Komatsu | H01J 37/32238 118/723 AN |
| 2016/0177448 | A1* | 6/2016 | Ikeda | H01J 37/32449 118/723 AN |
| 2017/0170010 | A1* | 6/2017 | Miyahara | H01L 21/0234 |
| 2017/0263421 | A1* | 9/2017 | Ikeda | H01J 37/32266 |
| 2018/0127880 | A1* | 5/2018 | Kotani | C23C 16/345 |
| 2018/0218880 | A1* | 8/2018 | Taniike | C23C 16/45551 |
| 2018/0301388 | A1* | 10/2018 | Ikeda | C23C 16/52 |
| 2019/0085457 | A1* | 3/2019 | Ifuku | H01L 21/0262 |
| 2021/0084743 | A1 | 3/2021 | Spitz | |
| 2021/0249229 | A1* | 8/2021 | Suenobu | H01J 37/32311 |
| 2023/0106303 | A1* | 4/2023 | Ikeda | H01J 37/32238 427/575 |
| 2024/0170260 | A1* | 5/2024 | Ikeda | H01J 37/16 |

FOREIGN PATENT DOCUMENTS

| | | | | |
|---|---|---|---|---|
| EP | 0 459 177 | A2 | 5/1991 | |
| EP | 3 155 631 | B1 | 8/2020 | |
| JP | 1-184921 | A | 7/1989 | |
| JP | 1-222057 | A | 9/1989 | |
| JP | 4-230019 | A | 8/1992 | |
| JP | 5921241 | B2 * | 5/2016 | H05H 1/46 |
| WO | WO-2007060867 | A1 * | 5/2007 | H01J 37/32192 |
| WO | WO-2007091672 | A1 * | 8/2007 | H01J 37/32192 |
| WO | WO 2012/121132 | A1 | 9/2012 | |
| WO | WO-2022163661 | A1 * | 8/2022 | H01J 37/32229 |

OTHER PUBLICATIONS

Extended European Search Report for European Application No. 22745881.7, dated Nov. 28, 2024.
Hasegawa et al., "Microwave plasma generation by the fast rotation and slow pulsation of resonant fields in a cylindrical cavity," Japanese Journal of Applied Physics, vol. 56, No. 4, XP093225597, Mar. 17, 2017, pp. 1-35.
Hasegawa et al., "Microwave plasma generation using cylindrical cavities and solid-state amplifiers", Proceeding of the 63rd JSAP Spring Meeting, 2016, total 4 pages.
International Search Report (PCT/ISA/210) issued in PCT/JP2022/002724, dated Mar. 1, 2022.
Kim et al., "Diamond growth by supplying electronically excited high-density radicals, Diamond growth by using a high density radical source with nonthermal plasma", Proceedings of the 78th Annual Meeting of the Japan Society of Applied Physics Autumn Conference (2017 Fukuoka International Conference Center), 2017, total 3 pages.
Writen Opinion of the International Searching Authority (PCT/ISA/237) issued in PCT/JP2022/002724, dated Mar. 1, 2022.

* cited by examiner

[FIG. 1]
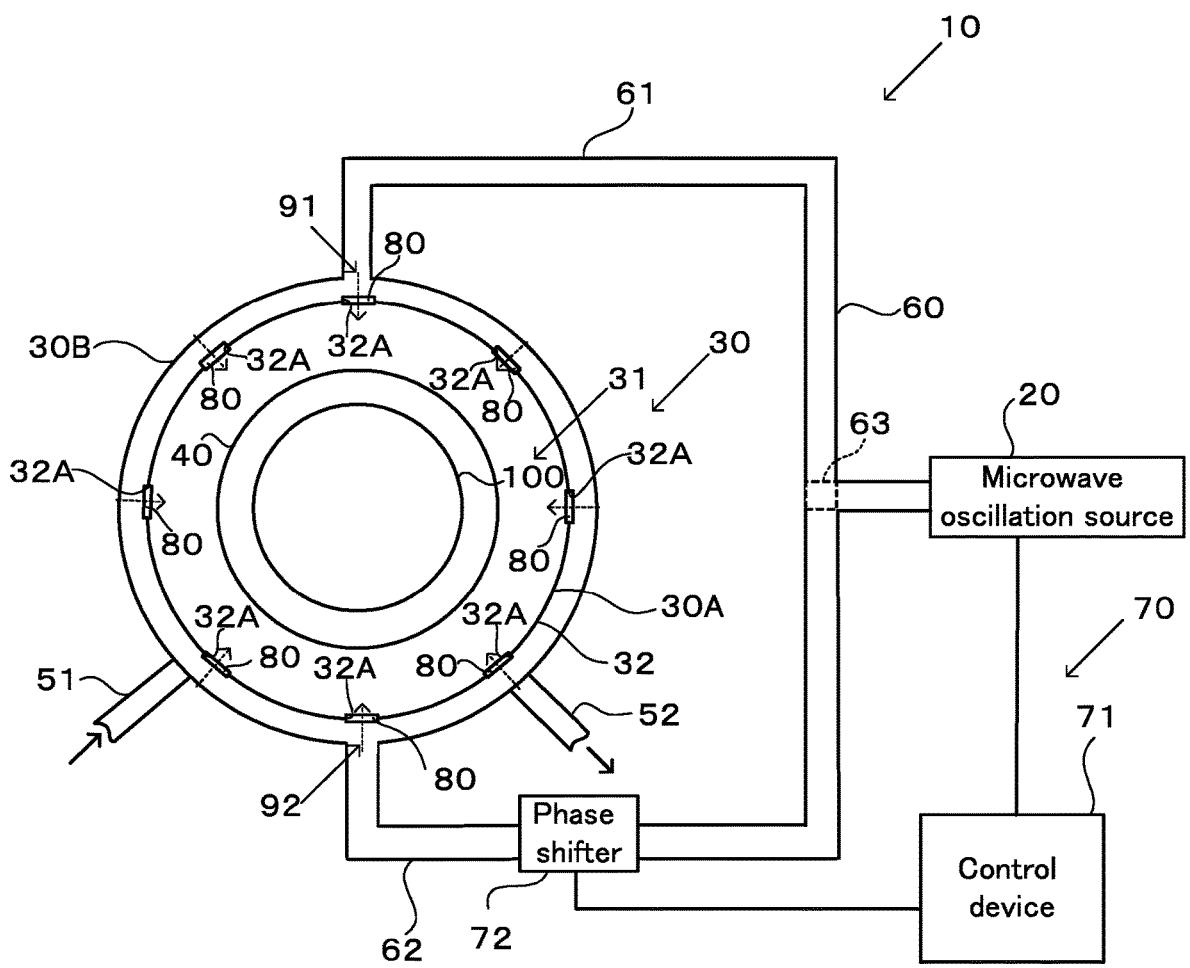

[FIG. 2]
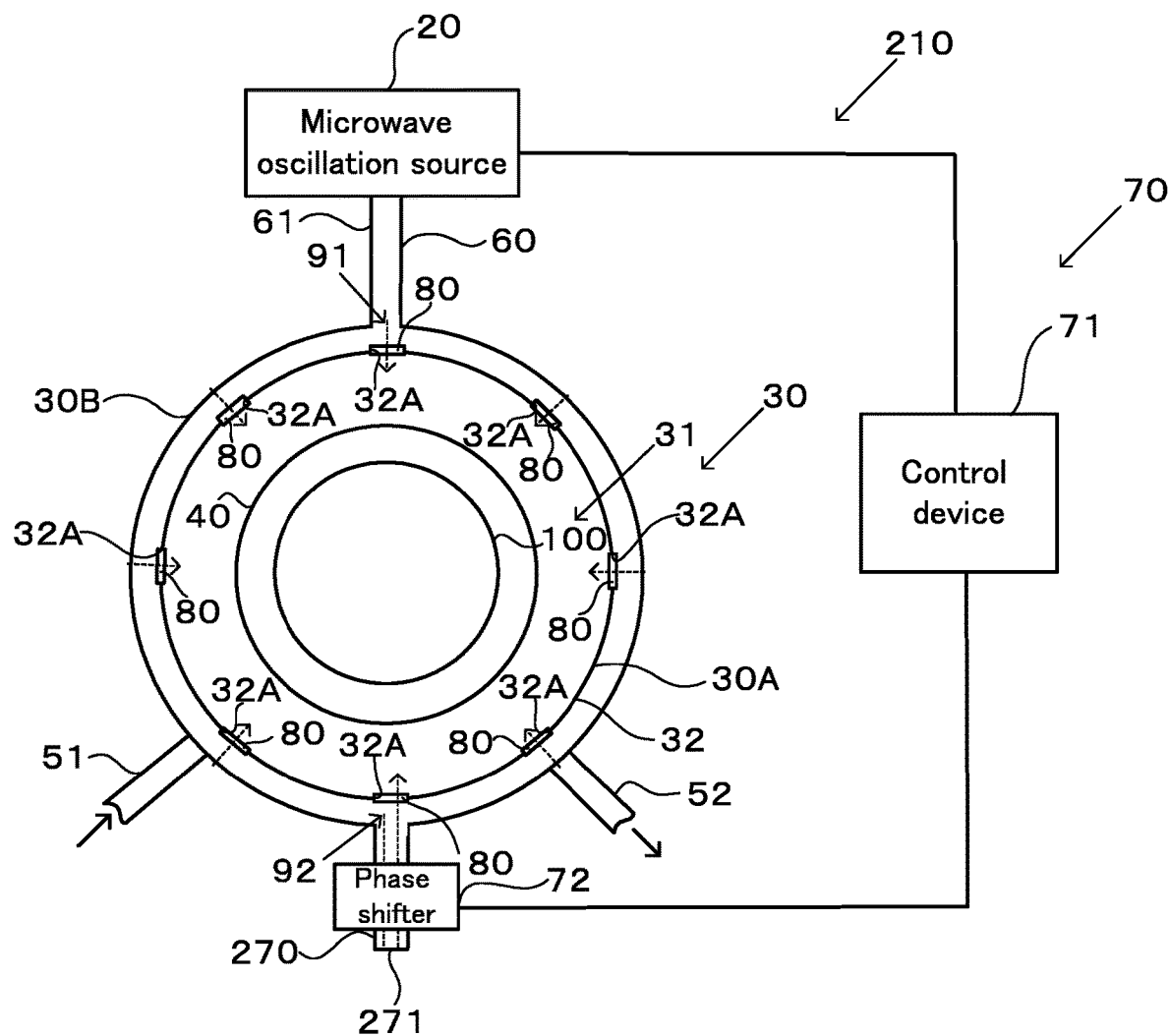

[FIG. 3]
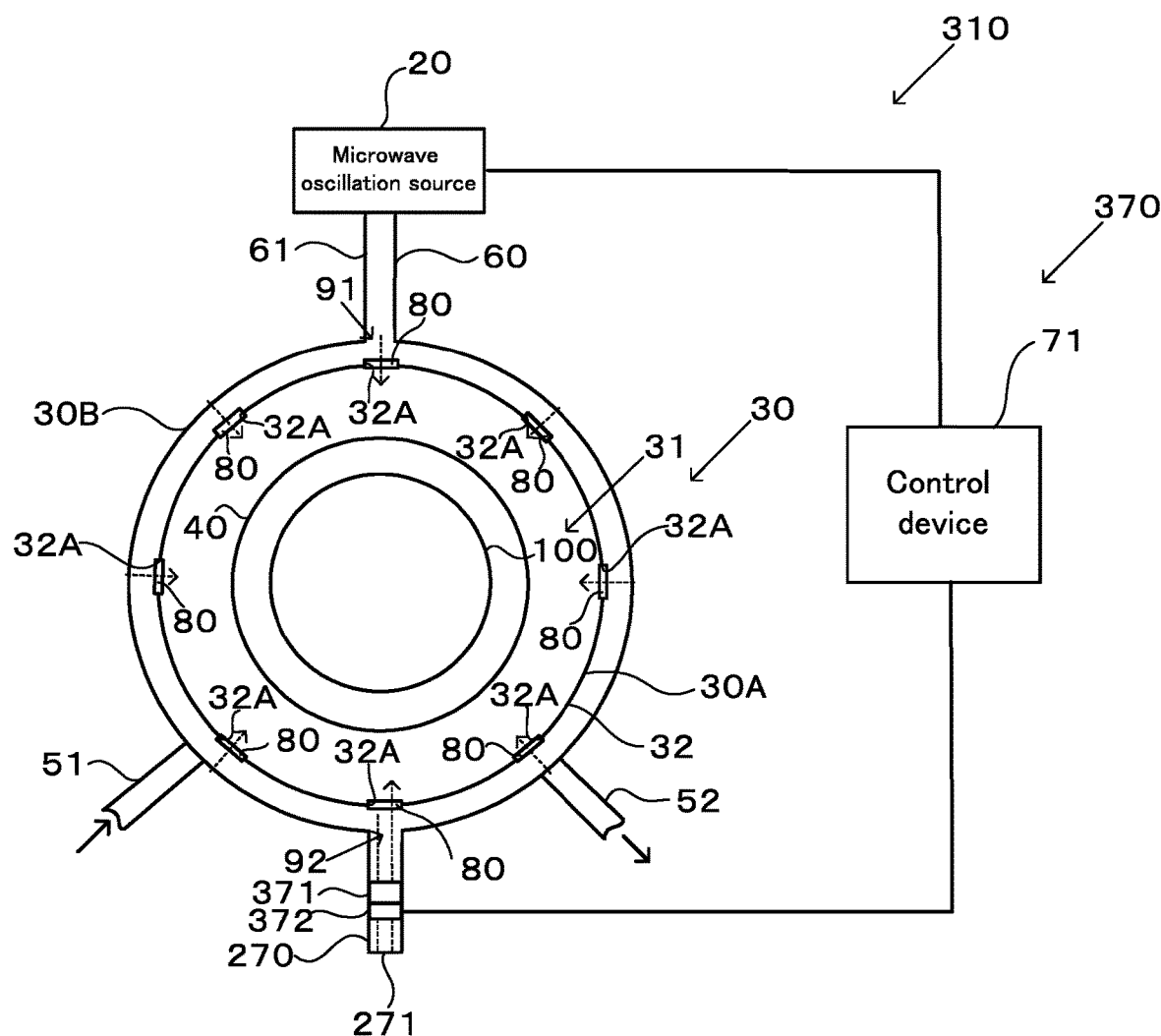

[FIG. 4]
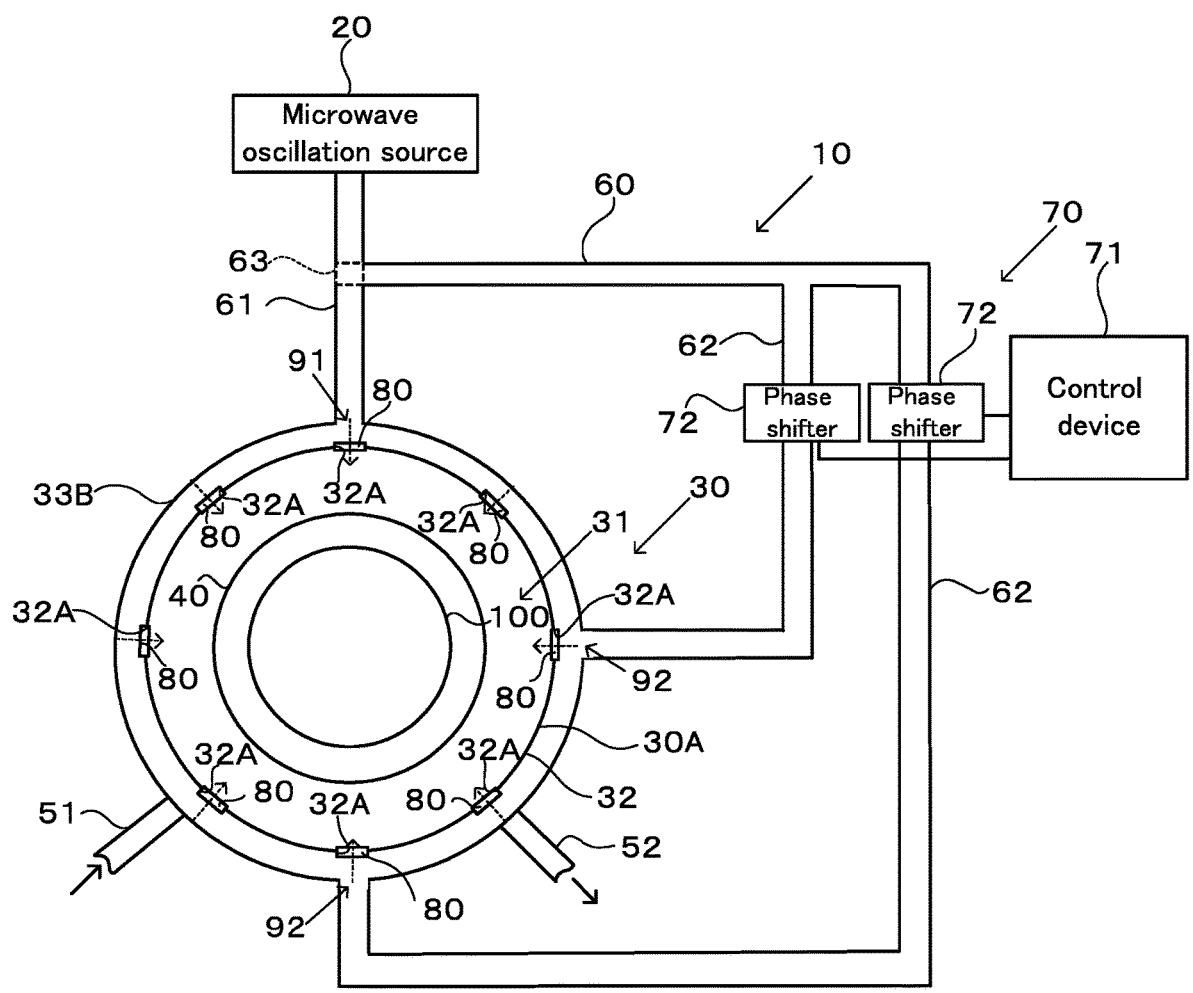

[FIG. 5]
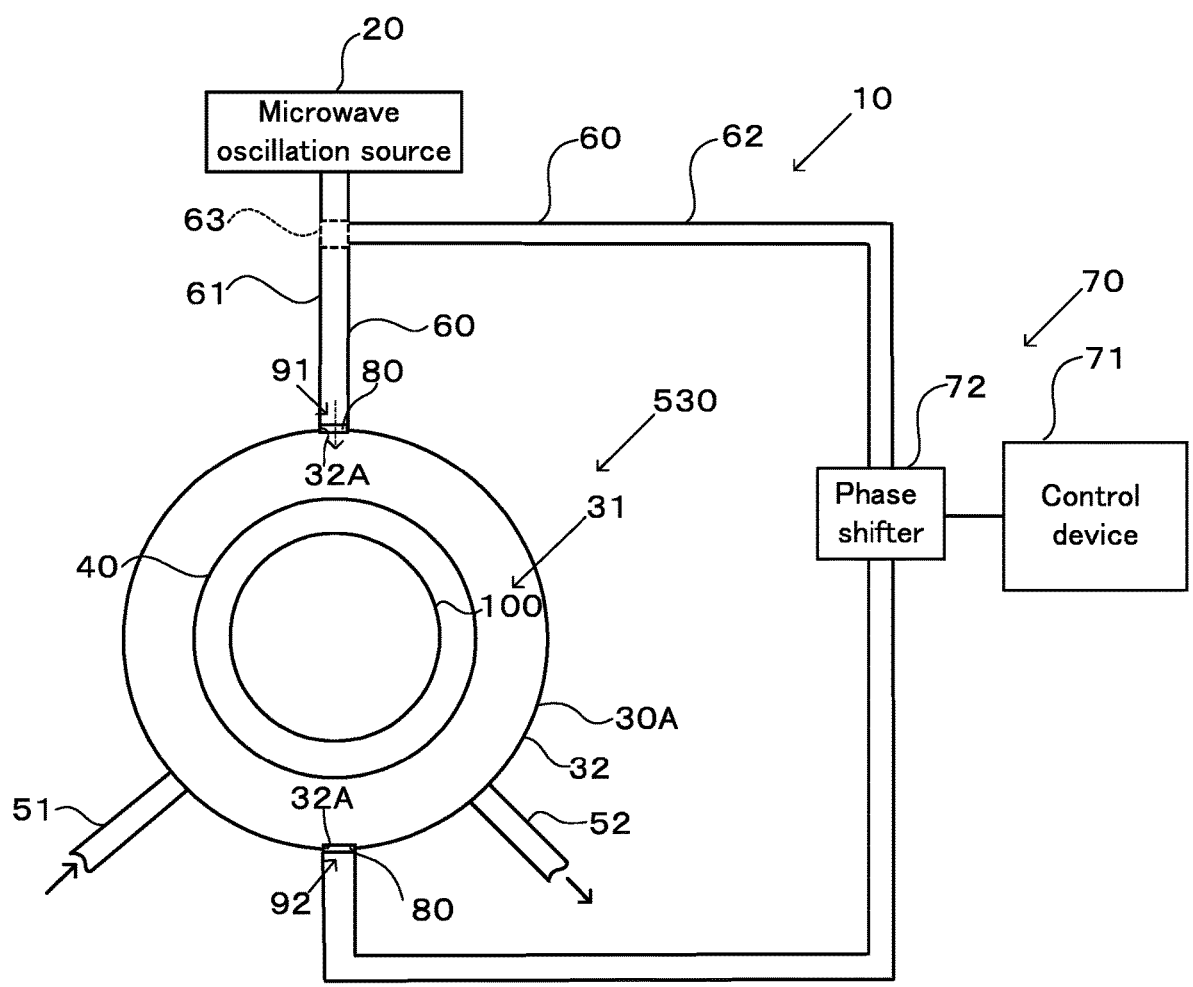

MICROWAVE PLASMA TREATMENT DEVICE

TECHNICAL FIELD

The present invention relates to a microwave plasma treatment device.

BACKGROUND ART

Diamond has a plurality of highest-level physical property values. Therefore, in recent years, in the fields where diamond is used because of the high thermal conductivity of diamond, there is a demand for high-speed diamond film formation with a film formation range of more than 3 inches. With a conventional microwave plasma treatment device for diamond film formation, a diamond substrate is manufactured using a so-called CVD (Chemical Vapor Deposition) method in which microwaves are output from a microwave oscillation source into a container, which is a part of a resonator, to generate a plasma ball near a substrate placed in the container. The size of the plasma ball generated, in other words, a diamond film formation range, has correlation with the frequency of microwaves output.

With a microwave plasma treatment device having a microwave frequency of 2.45 GHz, the diamond film formation range is limited to about 1 to 2 inches, and the position of the plasma ball generated is also fixed. On the other hand, there are cases where microwaves with a low frequency of about 915 MHz are used in order to increase the diamond film formation range, but power efficiency significantly decreases, and the scale of the device is also extremely large.

Therefore, as described in Patent Literature 1, a microwave plasma treatment device has been proposed, which controls the position of the plasma ball generated and the like by controlling a region with a strong electric field, using a plurality of phase control power sources. According to the microwave plasma treatment device disclosed in Patent Literature 1, it is possible to increase a diamond film formation range without using low-frequency microwaves.

CITATION LIST

Patent Literature

Patent Literature 1: JP H4-230019A

SUMMARY OF INVENTION

Technical Problem

The above microwave plasma treatment device has a complicated structure because a phase shifter and an amplifier are arranged for each path for introducing microwaves supplied into a reaction container. Note that such issues are not limited to a case where a diamond substrate is manufactured, and may also arise in a case where other substrates are manufactured.

The present invention aims to provide a microwave plasma treatment device capable of manufacturing a large-area substrate with a simple configuration.

Solution to Problem

A microwave plasma treatment device according to a first aspect of the present invention includes a resonator including a container; a single microwave oscillation source configured to output a reference microwave to the resonator; a waveguide that connects the microwave oscillation source and the resonator to each other; and a phase control mechanism configured to generate a modified microwave having a phase different from a phase of the reference microwave by controlling a phase of a divided part of the reference microwave; in which the resonator includes one or more first-type introducing portions for introducing the reference microwave into the resonator, and one or more second-type introducing portions for introducing the modified microwave into the resonator, and the microwave plasma treatment device is configured such that at least one of a position, a size, and a shape of a plasma ball generated in the container is changed by superimposing the modified microwave on the reference microwave in the resonator.

A microwave plasma treatment device according to a second aspect of the present invention includes a resonator including a container; a single microwave oscillation source configured to output a reference microwave to the resonator; and a phase control mechanism configured to generate a modified microwave having a phase different from a phase of the reference microwave by controlling a phase of a part of the reference microwave introduced into the resonator, in which the microwave plasma treatment device is configured such that at least one of a position, a size, and a shape of a plasma ball generated in the container is changed by superimposing the modified microwave on the reference microwave in the resonator.

A microwave plasma treatment device according to a third aspect of the present invention is the microwave plasma treatment device according to the second aspect, in which the resonator has a port connected to the container, and the phase control mechanism includes a reflector disposed in the port, and a driving mechanism configured to change a position of the reflector in the port.

A microwave plasma treatment device according to a fourth aspect of the present invention is the microwave plasma treatment device according to any one of the first to third aspects, in which the phase control mechanism includes a phase shifter and a control device configured to control the phase shifter.

A microwave plasma treatment device according to a fifth aspect of the present invention is the microwave plasma treatment device according to any one of the first to fourth aspects, in which the phase control mechanism dynamically moves the plasma ball in the resonator.

Advantageous Effects of Invention

According to a microwave plasma treatment device relating to the present invention, it is possible to manufacture a large-area substrate with a simple configuration.

BRIEF DESCRIPTION OF DRAWINGS

FIG. 1 is a schematic diagram of a microwave plasma treatment device according to a first embodiment;

FIG. 2 is a schematic diagram of a microwave plasma treatment device according to a second embodiment;

FIG. 3 is a schematic diagram of a microwave plasma treatment device according to a third embodiment;

FIG. 4 is a schematic diagram of a microwave plasma treatment device according to a variation of the first embodiment; and FIG. 5 is a schematic diagram of a microwave plasma treatment device according to another variation of the first embodiment.

DESCRIPTION OF EMBODIMENTS

Hereinafter, a microwave plasma treatment device according to an embodiment of the present invention will be described with reference to the drawings.

1. First Embodiment 1-1. Overall Configuration of Microwave Plasma Treatment Device FIG. 1 is a schematic diagram of a microwave plasma treatment device 10 according to this embodiment. The microwave plasma treatment device 10 is used to manufacture a large diamond substrate having a diameter of at least 100 mm or more, through CVD, for example. The microwave plasma treatment device 10 includes a single microwave oscillation source 20, a resonator 30, a waveguide 60, and a phase control mechanism 70.

The microwave oscillation source 20 outputs microwaves to be supplied into a container 30A of the resonator 30. The microwave oscillation source 20 is a magnetron power source, for example. The center frequency of the microwaves output from the microwave oscillation source 20 is, 2.45 GHz, 915 MHz, or 10 GHz or more, for example. Hereinafter, a microwave output from the microwave oscillation source 20 may be referred to as a "reference microwave".

The resonator 30 includes the container 30A, an outer circumferential waveguide 30B, a substrate support base 40, a source gas supply path 51, an exhaust path 52, and entrance windows 80. The container 30A is a vacuum container. Pressure inside the container 30A is in a range of 50 Torr to 200 Torr, for example. The shape of the container 30A can be selected as appropriate. In this embodiment, the container 30A has a cylindrical shape. The outer circumferential waveguide 30B to be connected to the waveguide 60 is attached to a circumferential wall 32 of the container 30A. The outer circumferential waveguide 30B is shaped to surround the container 30A along the circumferential wall 32 of the container 30A. The substrate support base 40 is housed in an internal space 31 of the container 30A. A base member 100 for manufacturing a diamond substrate is placed on the substrate support base 40. The shape of the substrate support base 40 can be selected as appropriate. In this embodiment, the substrate support base 40 is disk-shaped.

A material constituting the base member 100 can be selected as appropriate as long as a film of carbon particles in later-described source gas is formed on the base member 100, and the material enables diamond having a diamond crystal structure to grow. Examples of the material constituting the base member 100 include single crystal diamond, polycrystalline diamond, silicon, 3C silicon carbide, gallium nitride, gallium oxide, iridium, platinum, nickel, magnesium oxide, yttrium-stabilized zirconia, and metals having a high melting point, such as molybdenum.

The source gas supply path 51 supplies source gas for forming a diamond substrate to the internal space 31 in the container 30A. The source gas supply path 51 is connected to the circumferential wall 32 of the container 30A below or above the outer circumferential waveguide 30B in a height direction of the container 30A. Source gas is mixed gas containing carbon, hydrogen, nitrogen, and oxygen, for example.

The exhaust path 52 is connected to the circumferential wall 32 of the container 30A below or above the outer circumferential waveguide 30B in the height direction of the container 30A, for example, so that gas inside the container 30A can be exhausted. An end portion of the exhaust path 52 opposite to the container 30A is connected to a vacuum pump (not shown). When the vacuum pump operates, the gas inside the container 30A passes through the exhaust path 52 and is exhausted to the outside of the container 30A.

The waveguide 60 connects the microwave oscillation source 20 and the outer circumferential waveguide 30B to each other so that the reference microwave output from the microwave oscillation source 20 and a microwave obtained by modifying the phase of the reference microwave by the phase control mechanism 70 (hereinafter, may be referred to as a "modified microwave") can be introduced into the container 30A. The waveguide 60 is a circular waveguide or rectangular waveguide, for example. The waveguide 60 includes a first portion 61 and a second portion 62. The first portion 61 and the second portion 62 are connected to the microwave oscillation source 20 via distributor 63. The reference microwave output from the microwave oscillation source 20 is distributed into the first portion 61 and the second portion 62 via distributor 63. The reference microwave, which passes through the first portion 61 and is introduced into the outer circumferential waveguide 30B, is divided between one circumferential direction and the other circumferential direction of the outer circumferential waveguide 30B.

Holes 32A are formed in the circumferential wall 32 of the container 30A. The number of holes 32A formed in the container 30A can be selected as appropriate. In this embodiment, eight holes 32A are formed in the container 30A at predetermined intervals along the circumferential direction. The number of holes 32A formed in the container 30A may be 1 to 7, or 9 or more. An entrance window 80, which allows transmission of mixed microwave of the reference microwave and the modified microwave, is fitted to each hole 32A. A material constituting the entrance window 80 is quartz glass or alumina, for example.

The resonator 30 has a first-type introducing portion 91 and a second-type introducing portion 92. The first-type introducing portion 91 is a portion where the first portion 61 and the outer circumferential waveguide 30B are connected to each other, and introduces the reference microwave to the outer circumferential waveguide 30B without modifying the phase and amplitude of the reference microwave. The second-type introducing portion 92 is a portion where the second portion 62 and the outer circumferential waveguide 30B are connected to each other, and introduces the modified microwave to the outer circumferential waveguide 30B. The reference microwave introduced into the outer circumferential waveguide 30B via the first-type introducing portion 91, and the modified microwave introduced into the outer circumferential waveguide 30B via the second-type introducing portion 92 travel through the outer circumferential waveguide 30B, are mixed, and are introduced into the container 30A through the plurality of holes 32A and the entrance windows 80.

The phase control mechanism 70 generates a modified microwave by modifying the phase of the reference microwave passing through the second portion 62. The phase control mechanism 70 includes a control device 71 and a phase shifter 72.

The control device 71 is, for example, a PC (Personal Computer) or a PLC (Programmable Logic Controller), and controls the phase shifter 72 by outputting, to the phase shifter 72, a phase control signal based on a phase shifter control program. The phase shifter 72 is disposed in an intermediate portion of the second portion 62.

The control device 71 controls the phase shifter 72 so as to modify the phase of the reference microwave passing through the phase shifter 72, such that the modified microwave is generated. The reference microwave that has passed through the first-type introducing portion 91, and the modified microwave that has passed through the second-type introducing portion 92 are introduced into the outer circumferential waveguide 30B, and thus the reference microwave and the modified microwave interfere with each other. Therefore, a region having a locally high electric field intensity is formed in the container 30A. By separating molecules of the source gas into electrons and chemically active species, a plasma ball is generated in a region having a locally high electric field intensity. The chemically active species include ions and radicals. The diameter of the plasma ball generated is 50 mm, for example. The control device 71 can change an electric field intensity distribution by controlling the phase shifter 72, in other words, by controlling the phase of the modified microwave, and as a result, at least one of the position, size, and shape of the plasma ball is controlled. The position of the plasma ball usually indicates the position of the plasma ball above the base member 100 in the container 30A. The size of the plasma ball is the diameter of the plasma ball. The shape of the plasma ball is an outer shape of the plasma ball. A basic outer shape of the plasma ball is a sphere, and an outer shape of a modified plasma ball is a flattened sphere, for example. Chemically active species contained in a plasma ball undergo reaction on the surface of the base member 100, diamond crystals are formed and grow, and thus a diamond substrate is manufactured. The manufactured diamond substrate includes the base member 100 and the diamond crystals formed on the base member 100.

The relationships regarding the phases of the reference microwave and the modified microwave, the position of the plasma ball above the base member 100, the size of the plasma ball, and the shape of the plasma ball are obtained through simulation in advance. The simulation results may be stored in the control device 71 together with the phase shifter control program. The control device 71 vibrates the plasma ball above the base member 100, for example. In other words, the control device 71 dynamically moves the plasma ball above the base member 100. Therefore, a large-area diamond substrate can be formed.

1-2. Functions and Effects of Microwave Plasma Treatment Device

According to the microwave plasma treatment device 10, a part of the reference microwave output from a single microwave oscillation source 20 is introduced into the outer circumferential waveguide 30B via the first portion 61 and the first-type introducing portion 91. On the other hand, another part of the reference microwave is introduced into the second portion 62, and the phase thereof is modified by the phase shifter 72, and as a result, the reference microwave is converted into a modified microwave. The modified microwave is introduced into the outer circumferential waveguide 30B via the second portion 62 and the second-type introducing portion 92. The phase control mechanism 70 changes at least one of the position, size, and shape of the plasma ball in the container 30A by superimposing the modified microwave, which is introduced into the outer circumferential waveguide 30B via the second-type introducing portion 92, on the reference microwave introduced into the outer circumferential waveguide 30B via the first-type introducing portion 91. According to the microwave plasma treatment device 10, the phase and the like of the reference microwave passing through the first portion 61 are not modified, and thus it is possible to change the position, size, and shape of the plasma ball without disposing a phase shifter, an amplifier, and the like in the first portion 61. Therefore, a configuration thereof can be simplified. Also, because a phase shifter, an amplifier, and the like are not disposed in the first portion 61, manufacturing costs can be reduced.

2. Second Embodiment

A microwave plasma treatment device 210 according to a second embodiment will be described with reference to FIG. 2. In the following description, constituent elements that are the same as those in the first embodiment are given the same reference numerals, and their description will be omitted. The following mainly describes portions that are different from those in the first embodiment.

FIG. 2 is a schematic diagram of a microwave plasma treatment device 210 according to this embodiment. According to the microwave plasma treatment device 210, the reference microwave output from a microwave oscillation source 20 is introduced into the outer circumferential waveguide 30B. A part of the reference microwave introduced into the outer circumferential waveguide 30B is converted into a modified microwave by a phase control mechanism 70, and is superimposed on the reference microwave. The microwave plasma treatment device 210 includes a port 270.

The port 270 is connected to the outer circumferential waveguide 30B. A position where the port 270 is connected in the outer circumferential waveguide 30B can be selected as appropriate. In this embodiment, the port 270 is connected thereto at a position of the outer circumferential waveguide 30B where the port 270 faces the first portion 61 via the container 30A. The number of ports 270 connected to the outer circumferential waveguide 30B can be selected as appropriate. In this embodiment, the number of ports 270 connected to the outer circumferential waveguide 30B is one. The number of ports 270 connected to the outer circumferential waveguide 30B may be two or more.

The reference microwave output from the microwave oscillation source 20 is introduced into the outer circumferential waveguide 30B, and travels through the outer circumferential waveguide 30B. A part of the reference microwave introduced into the outer circumferential waveguide 30B is introduced into the port 270. The reference microwave introduced into the port 270 is reflected by a wall 271 at an end of the port 270 opposite to the container 30A, and passes through the phase shifter 72. The phase of the reference microwave that has passed through the phase shifter 72 is modified, and the reference microwave is converted into a modified microwave. The modified microwave is introduced into the outer circumferential waveguide 30B. The reference microwave and the modified microwave travel through the outer circumferential waveguide 30B, are mixed together, and introduced into the container 30A through a plurality of holes 32A and entrance windows 80.

With the microwave plasma treatment device 210 according to this embodiment, a part of the reference microwave introduced into the outer circumferential waveguide 30B is introduced into the port 270, and converted into a modified microwave. The modified microwave is mixed with the reference microwave in the outer circumferential waveguide 30B. In the outer circumferential waveguide 30B, the modified microwave is superimposed on the reference microwave, and thus an effect equivalent to that of the microwave plasma treatment device 10 according to the first embodiment can be obtained.

3. Third Embodiment

A third embodiment differs from the second embodiment in a configuration of the phase control mechanism 70. Basically, other configurations are similar to those of the second embodiment. In the following description, constituent elements that are the same as those in the second embodiment are given the same reference numerals, and their description will be omitted. The following mainly describes portions that are different from those in the second embodiment.

FIG. 3 is a schematic diagram of a microwave plasma treatment device 310 according to this embodiment. The microwave plasma treatment device 310 includes a phase control mechanism 370. The phase control mechanism 370 includes a reflector 371 and a driving mechanism 372, which are disposed in a port 270.

The reflector 371 reflects the reference microwave introduced into the port 270 toward the outer circumferential waveguide 30B. The driving mechanism 372 changes the position of the reflector 371 in the longitudinal direction of the port 270. Any configuration can be used for the driving mechanism 372. In this embodiment, the driving mechanism 372 is a ball screw mechanism that includes a guide rail, a screw shaft that moves the reflector 371 along the guide rail, a motor that rotates the screw shaft, and the like.

The control device 71 executes a driving mechanism control program regarding the operation of the driving mechanism 372 in response to a request from an operator. A relationship between the position of the reflector 371 in the port 270 and the phase of the modified microwave is obtained through simulation in advance. The simulation results may be stored in the control device 71 together with the driving mechanism control program. Also, similarly to the first embodiment, the relationships regarding the phases of the reference microwave and the modified microwave, the position of the plasma ball above the base member 100, the size of the plasma ball, and the shape of the plasma ball are obtained through simulation in advance. The simulation results may be stored in the control device 71. With the microwave plasma treatment device 310 according to this embodiment, it is possible to obtain effects similar to those of the microwave plasma treatment device 210 according to the second embodiment.

4. Variations

Each of the embodiments is an example of a form that the microwave plasma treatment device according to the present invention can take, and is not intended to limit the form. The microwave plasma treatment device according to the present invention can take a form different from those exemplified in each embodiment. An example thereof is a form in which some of constituent elements of each embodiment are replaced, changed, or omitted, or a new constituent element is added to each embodiment. Hereinafter, some examples of variations of the embodiments will be described.

4-1

In the first embodiment, a specific configuration of the waveguide 60 can be changed as appropriate. As shown in FIG. 4, the waveguide 60 may be configured to include a plurality of second portions 62, for example. In this variation, phase shifters 72 are respectively disposed in the plurality of second portions 62. In this variation, the number of first-type introducing portions 91 in the resonator is one, and the number of second-type introducing portions 92 is two.

4-2

In the first embodiment, a specific configuration of the resonator 30 can be changed as appropriate. FIG. 5 is a schematic diagram of a microwave plasma treatment device that includes a resonator 530, which is a variation of the resonator 30 according to the first embodiment. As shown in FIG. 5, the resonator 30 may be replaced with the resonator 530 having no outer circumferential waveguide 30B, and the first portion 61 and the second portion 62 may be connected to the container 30A, for example. In this variation, a portion where the first portion 61 is connected to the container 30A constitutes a first-type introducing portion 91, and a portion where the second portion 62 is connected to the container 30A constitutes a second-type introducing portion 92. Entrance windows 80 are installed in the first-type introducing portion 91 and the second-type introducing portion 92. Also, in this variation, holes 32A in the circumferential wall 32 of the container 30A other than the portions connected to the waveguide 60 are closed. Note that this variation can also be applied to a variation of the first embodiment shown in FIG. 4.

4-3

In the second and third embodiments, a specific configuration of the resonator 30 can be changed as appropriate. In the second and third embodiments, the resonator 30 may be replaced with a resonator having no outer circumferential waveguide 30B, the first portion 61 may be connected to the container 30A, and the port 270 may be connected to the container 30A such that the reference microwave is introduced into the resonator 30A, for example. In this variation, a portion where the first portion 61 is connected to the container 30A constitutes a first-type introducing portion 91, and a portion where the port 270 is connected to the container 30A constitutes a second-type introducing portion 92. Entrance windows 80 are installed in the first-type introducing portion 91 and the second-type introducing portion 92. Also, in this variation, holes 32A other than the portion of the container 30A connected to the first portion 61 and the portions connected to the port 270 are closed. In this variation, one or more ports 270 may be connected to the container 30A.

4-4

In the first embodiment, the circumferential wall 32 of the container 30A may be omitted. In this variation, a portion where the first portion 61 is connected to the outer circumferential waveguide 30B constitutes a first-type introducing portion 91, and a portion where the second portion 62 is connected to the outer circumferential waveguide 30B constitutes a second-type introducing portion 92. Entrance windows 80 are installed in the first-type introducing portion 91 and the second-type introducing portion 92. In this variation, the outer circumferential waveguide 30B serves as the circumferential wall 32 of the container 30A. Note that this variation can also be applied to a variation of the first embodiment shown in FIG. 4.

4-5

In the second and third embodiments, the circumferential wall 32 of the container 30A may be omitted. In this variation, a portion where the first portion 61 is connected to the outer circumferential waveguide 30B constitutes a first-type introducing portion 91, and a portion where the port 270 is connected to the outer circumferential waveguide 30B constitutes a second-type introducing portion 92. Entrance windows 80 are installed in the first-type introducing portion 91 and the second-type introducing portion 92. In this variation, the outer circumferential waveguide 30B serves as the circumferential wall 32 of the container 30A.

4-6

In the second and third embodiments, specific configurations of the phase control mechanisms 70 and 370 can be changed as appropriate. The phase control mechanisms 70 and 370 may be any structure that is disposed in the container 30A and modifies the phase of the reference microwave introduced into the container 30A and reflects the modified microwave. Also, the phase control mechanisms 70 and 370 may be configured to change a radial shape of the circumferential wall 32 of the container 30A. In short, the phase control mechanisms 70 and 370 can have any configuration as long as a modified microwave whose phase is different from the phase of the reference microwave can be generated by controlling the phase of a part of the reference microwave introduced into the resonator 30.

4-7

In the second and third embodiments, a shape in which the circumferential wall 32 of the container 30A is connected to the microwave oscillation source 20 is also possible by omitting the waveguide 60 and the outer circumferential waveguide 30B.

4-8

In the second and third embodiments, the phase control mechanism 70 and the phase control mechanism 370 can be combined. When a plurality of ports 270 are provided, for example, a phase shifter 72 may be disposed in any port 270, and the reflector 371 and the driving mechanism 372 may be disposed in any other port 270. In this variation, the phase shifter 72 and the driving mechanism 372 may be controlled by a single control device 71, or control devices may respectively control the phase shifter 72 and the driving mechanism 372.

4-9

Although the microwave plasma treatment devices 10, 210, and 310 according to the first to third embodiments are used to manufacture a diamond substrate, these devices can also be used to manufacture other substrates by changing source gas and conditions such as plasma transfer periods.

LIST OF REFERENCE NUMERALS

10, 210, 310 Microwave plasma treatment device
20 Microwave oscillation source
30 Resonator
30A Container
60 Waveguide
70, 370 Phase control mechanism
71 Control device
72 Phase shifter
91 First-type introducing portion
92 Second-type introducing portion
270 Port
371 Reflector
372 Driving mechanism

The invention claimed is:

1. A microwave plasma treatment device comprising:
a resonator including a container;
a single microwave oscillation source configured to output a reference microwave to the resonator;
a waveguide that connects the microwave oscillation source and the resonator to each other; and
a phase control mechanism configured to generate a modified microwave having a phase different from a phase of the reference microwave by controlling a phase of a divided part of the reference microwave,
wherein the resonator includes one or more first-type introducing portions for introducing the reference microwave into the resonator, and one or more second-type introducing portions for introducing the modified microwave into the resonator, and
the microwave plasma treatment device is configured such that at least one of a position, a size, and a shape of a plasma ball generated in the container is changed by superimposing the modified microwave on the reference microwave in the resonator.

2. A microwave plasma treatment device comprising:
a resonator including a container;
a single microwave oscillation source configured to output a reference microwave to the resonator; and
a phase control mechanism configured to generate a modified microwave having a phase different from a phase of the reference microwave by controlling a phase of a part of the reference microwave introduced into the resonator,
wherein the microwave plasma treatment device is configured such that at least one of a position, a size, and a shape of a plasma ball generated in the container is changed by superimposing the modified microwave on the reference microwave in the resonator.

3. The microwave plasma treatment device according to claim 2,
wherein the resonator has a port connected to the container, and
the phase control mechanism includes a reflector disposed in the port, and a driving mechanism configured to change a position of the reflector in the port.

4. The microwave plasma treatment device according to claim 1,
wherein the phase control mechanism includes a phase shifter and a control device configured to control the phase shifter.

5. The microwave plasma treatment device according to claim 1,
wherein the phase control mechanism dynamically moves the plasma ball in the resonator.

6. The microwave plasma treatment device according to claim 2,
wherein the phase control mechanism includes a phase shifter and a control device configured to control the phase shifter.

7. The microwave plasma treatment device according to claim 3,
wherein the phase control mechanism includes a phase shifter and a control device configured to control the phase shifter.

8. The microwave plasma treatment device according to claim 2,
wherein the phase control mechanism dynamically moves the plasma ball in the resonator.

9. The microwave plasma treatment device according to claim 3,
wherein the phase control mechanism dynamically moves the plasma ball in the resonator.

10. The microwave plasma treatment device according to claim 4, wherein the phase control mechanism dynamically moves the plasma ball in the resonator.

* * * * *